US011217691B2

(12) United States Patent
Ningaraju et al.

(10) Patent No.: US 11,217,691 B2
(45) Date of Patent: Jan. 4, 2022

(54) HIGH-VOLTAGE SEMICONDUCTOR DEVICES HAVING BURIED LAYER OVERLAPPED WITH SOURCE AND WELL REGIONS

(71) Applicant: Nuvoton Technology Corporation, Hsinchu Science Park (TW)

(72) Inventors: Vivek Ningaraju, Mysore (IN); Po-An Chen, Toufen (TW)

(73) Assignee: Nuvoton Technology Corporation, Hsinchu Science Park (TW)

( * ) Notice: Subject to any disclaimer, the term of this patent is extended or adjusted under 35 U.S.C. 154(b) by 181 days.

(21) Appl. No.: 16/527,452

(22) Filed: Jul. 31, 2019

(65) Prior Publication Data
US 2020/0144415 A1 May 7, 2020

(30) Foreign Application Priority Data
Nov. 7, 2018 (TW) .................................. 107139477

(51) Int. Cl.
*H01L 29/78* (2006.01)
*H01L 29/06* (2006.01)
(Continued)

(52) U.S. Cl.
CPC ........ *H01L 29/7816* (2013.01); *H01L 29/063* (2013.01); *H01L 29/0623* (2013.01);
(Continued)

(58) Field of Classification Search
CPC ............. H01L 29/7816; H01L 29/0623; H01L 29/063; H01L 29/0646; H01L 29/0649;
(Continued)

(56) References Cited

U.S. PATENT DOCUMENTS 4,300,150 A * 11/1981 Colak ................. H01L 29/0634
257/336
9,508,845 B1 11/2016 Lin et al.
(Continued)

FOREIGN PATENT DOCUMENTS

CN 105720098 A 6/2016

OTHER PUBLICATIONS

Taiwanese Office Action of the corresponding TW patent application 107139477 dated Jun. 11, 2019; pp. 1-6.

*Primary Examiner* — Lex H Malsawma
(74) *Attorney, Agent, or Firm* — Muncy, Geissler, Olds and Lowe, P.C.

(57) ABSTRACT

A high-voltage semiconductor device includes a semiconductor substrate having a first conductivity type. A first well region is disposed on the semiconductor substrate and has the first conductivity type. A second well region is adjacent to the first well region and has a second conductivity type opposite to the first conductivity type. A first source region and a first drain region is respectively disposed in the first well region and the second well region, wherein the first source region and the first drain region has the second conductivity type. A first gate structure is disposed on the first well region and the second well region, and a buried layer is disposed in the semiconductor substrate and has the first conductivity type, wherein the buried layer is overlapped with the first well region and the second well region, and the buried layer is directly below the first source region.

19 Claims, 6 Drawing Sheets

(51) Int. Cl.
*H01L 29/08* (2006.01)
*H01L 29/10* (2006.01)

(52) U.S. Cl.
CPC ...... *H01L 29/0646* (2013.01); *H01L 29/0649* (2013.01); *H01L 29/0865* (2013.01); *H01L 29/0882* (2013.01); *H01L 29/1095* (2013.01)

(58) Field of Classification Search
CPC ............. H01L 29/0865; H01L 29/0882; H01L 29/1095
See application file for complete search history.

(56) References Cited

U.S. PATENT DOCUMENTS

| | | | |
|---|---|---|---|
| 2001/0026983 A1 | 10/2001 | Fujita | |
| 2002/0109184 A1 | 8/2002 | Hower et al. | |
| 2003/0173624 A1* | 9/2003 | Choi | H01L 29/1095 257/368 |
| 2011/0244642 A1 | 10/2011 | Chen et al. | |
| 2012/0175673 A1* | 7/2012 | Lee | H01L 29/66681 257/140 |
| 2012/0286359 A1* | 11/2012 | Lin | H01L 29/1045 257/335 |
| 2015/0187933 A1* | 7/2015 | Lin | H01L 29/0878 257/339 |
| 2016/0240660 A1* | 8/2016 | Yue | H01L 29/0878 |
| 2017/0077293 A1 | 3/2017 | Chien et al. | |
| 2017/0263717 A1 | 9/2017 | Lin et al. | |
| 2018/0342496 A1* | 11/2018 | Stefanov | H01L 29/87 |

* cited by examiner

HIGH-VOLTAGE SEMICONDUCTOR DEVICES HAVING BURIED LAYER OVERLAPPED WITH SOURCE AND WELL REGIONS

CROSS REFERENCE TO RELATED APPLICATIONS

This Application claims priority of Taiwan Patent Application No. 107139477, filed on Nov. 7, 2018, the entirety of which is incorporated by reference herein.

BACKGROUND

Field of the Invention

The present invention relates to semiconductor devices in particular to high-voltage semiconductor devices.

Description of the Related Art

High-voltage semiconductor device technology is suitable for using in the field of high-voltage and high-power integrated circuits (IC). Traditional high-voltage semiconductor devices, such as vertically diffused metal oxide semiconductor (VDMOS) transistors and laterally diffused metal oxide semiconductor (LDMOS) transistors, are mainly used in element application fields over 12V. The advantages of high-voltage device technology are that it is cost-effective and easily compatible with other processes. High-voltage device technology has been widely used in the fields of display driver IC elements, power supply, power management, communications, automotive electronics and industrial control, etc.

Although existing high-voltage semiconductor devices have gradually met their intended uses, they have not been fully met requirements in all aspects. There are still some problems with high-voltage semiconductor devices and manufacturing technology that need to be overcome.

BRIEF SUMMARY

In some embodiments of the disclosure, a high-voltage semiconductor device is provided. The high-voltage semiconductor device includes a semiconductor substrate having a first conductivity type and a first well region disposed on the semiconductor substrate, wherein the first well region has the first conductivity type. The high-voltage semiconductor device also includes a second well region adjacent to the first well region, wherein the second well region has a second conductivity type opposite to the first conductivity type. The high-voltage semiconductor device also includes a first source region and a first drain region respectively disposed in the first well region and the second well region, wherein the first source region and the first drain region have the second conductivity type. The high-voltage semiconductor device also includes a first gate structure disposed on the first well region and the second well region. The high-voltage semiconductor device also includes a buried layer disposed in the semiconductor substrate and having the first conductivity type, wherein the buried layer is overlapped with the first well region and the second well region, and the buried layer is directly below the first source region.

In some embodiments of the disclosure, a high-voltage semiconductor device is provided. The high-voltage semiconductor device includes a semiconductor substrate having a first conductivity type and a first well region disposed on the semiconductor substrate, wherein the first well region has the first conductivity type. The high-voltage semiconductor device also includes a second well region and a third well region disposed on the semiconductor substrate and on opposite sides of the first well region, wherein the second well region and the third well region have a second conductivity type that is opposite to the first conductivity type. The high-voltage semiconductor device also includes a first source region and a first drain region respectively disposed in the first well region and the second well region, wherein the first source region and the first drain region have the second conductivity type. The high-voltage semiconductor device also includes a second source region and a second drain region respectively disposed in the first well region and the third well region, wherein the second source region and the second drain region have the second conductivity type. The high-voltage semiconductor device also includes a first gate structure disposed on the first well region and the second well region. The high-voltage semiconductor device also includes a second gate structure disposed on the first well region and the third well region. The high-voltage semiconductor device also includes a buried layer disposed in the semiconductor substrate and vertically overlapped with the first source region and the second source region, wherein the buried layer has the first conductivity type.

In some embodiments of the disclosure, a high-voltage semiconductor device is provided. The high-voltage semiconductor device includes a semiconductor substrate having a first conductivity type and an epitaxial layer disposed on the semiconductor substrate, wherein the epitaxial layer has the first conductivity type. The high-voltage semiconductor device also includes a first well region and a second well region separately disposed in the epitaxial layer, wherein the first well region and the second well region have a second conductivity type that is opposite to the first conductivity type. The high-voltage semiconductor device also includes a first source region disposed in the epitaxial layer between the first well region and the second well region, and a first drain region disposed in the first well region, wherein the first source region and the first drain region have the second conductivity type. The high-voltage semiconductor device also includes a second source region disposed in the epitaxial layer between the first well region and the second well region, and a second drain region disposed in the second well region, wherein the second source region and the second drain region have the second conductivity type. The high-voltage semiconductor device also includes a first gate structure disposed on the epitaxial layer and partially overlapped with the first well region. The high-voltage semiconductor device also includes a second gate structure disposed on the epitaxial layer and partially overlapped with the second well region. The high-voltage semiconductor device also includes a buried layer disposed in the semiconductor substrate and having a portion extending into the epitaxial layer, the first well region and the second well region, wherein the buried layer has the first conductivity type.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
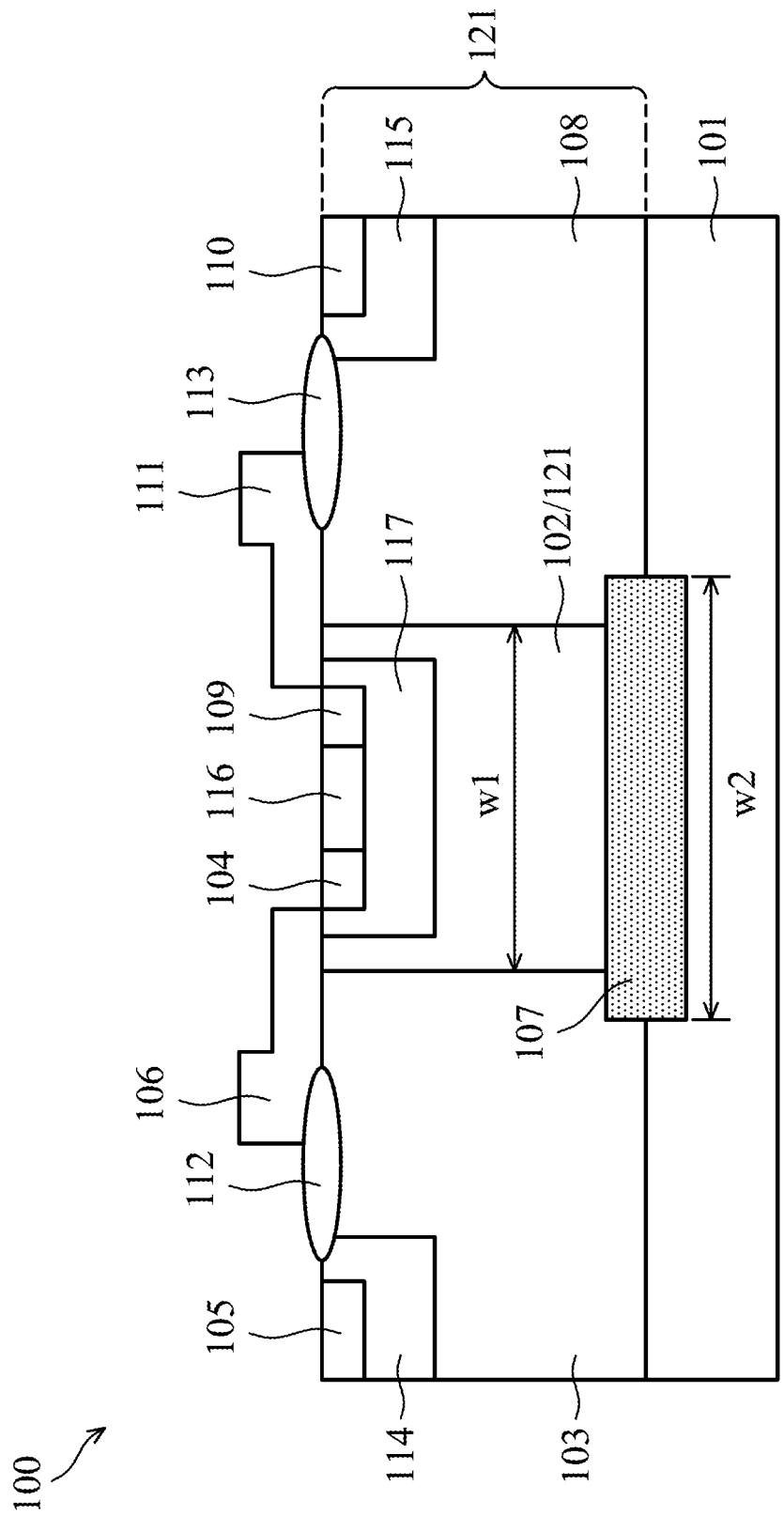
FIG. 1 shows a cross section of a high-voltage semiconductor device according to some embodiments of the disclosure.

The following disclosure provides many different embodiments, or examples, for implementing different features of the high-voltage semiconductor device provided. Specific examples of components and arrangements are described below to simplify the present disclosure. These are, of course, merely examples and are not intended to be limiting. For example, the formation of a first feature over or on a second feature in the description that follows may include embodiments in which the first and second features are aimed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described below. In different figures and illustrated embodiments, similar reference numerals are used to designate similar elements. It should be understood that additional operations can be provided before, during, and after the method, and some of the operations described can be replaced or eliminated for other embodiments of the method.

Refer to FIG. 1, which shows a cross section of a high-voltage semiconductor device 100 according to some embodiments of the disclosure. The high-voltage semiconductor device 100 includes a semiconductor substrate 101. The semiconductor substrate 101 may be made of silicon or other semiconductor materials. Alternatively, the semiconductor substrate 101 may include other element semiconductor materials, such as Ge. In some embodiments, the semiconductor substrate 101 is made of compound semiconductor, such as silicon carbide, gallium nitride, gallium arsenide, indium arsenide or indium phosphide. In some embodiments, the semiconductor substrate 101 is made of alloy semiconductor, such as silicon germanium, silicon germanium carbide, arsenic gallium phosphide or indium gallium phosphide.

In addition, the semiconductor substrate 101 may include silicon-on-insulator (SOI) substrate. In some embodiments, the semiconductor substrate 101 may be a lightly doped p-type or n-type substrate. In some embodiments, the semiconductor substrate 101 is p-type, which has a p-type dopant therein (such as boron (B)), and the high-voltage semiconductor device 100 subsequently formed may include an n-type laterally difftised metal oxide semiconductor (LD-MOS) transistor.

In some embodiments, the high-voltage semiconductor device 100 includes an epitaxial layer 121. The epitaxial layer 121 is disposed on the semiconductor substrate 101. In the embodiment, the epitaxial layer 121 is p-type. In some embodiments, the epitaxial layer 121 is formed by metal organic chemical vapor deposition (MOCVD), plasma-enhanced CVD (PECVD), molecular beam epitaxy (MBE), hydride vapor phase epitaxy (HVPE), liquid phase epitaxy (LPE), chloride-vapor phase epitaxy (Cl-VPE), another similar process, or a combination thereof. In some other embodiments, the high-voltage semiconductor device 100 may not include the epitaxial layer 121. Well regions and doping regions subsequently formed in the epitaxial layer 121 may be directly formed in the semiconductor substrate 101 (i.e. near the top surface of the semiconductor substrate 101).

As shown in FIG. 1, in some embodiments, the high-voltage semiconductor device 100 includes a first well region 102. The first well region 102 is disposed on the semiconductor substrate 101. In the embodiment, the first well region 102 is p-type. The first well region 102 has a horizontal width w1. In some embodiments, the horizontal width w1 is in a range between about 4.0 μm and about 6.0 μm. In some embodiments, the doping concentration of the first well region 102 is in a range between about $1 \times 10^{15}$ atoms/cm$^3$ and about $5 \times 10^{17}$ atoms/cm$^3$. In some embodiments, the first well region 102 is formed by an ion implantation process and a drive in process. In some other embodiments, wherein the high-voltage semiconductor device 100 may not include the first well region 102, the epitaxial layer 121 can have similar function as the first well region 102 and occupy the position of the first well region 102.

In some embodiments, the high-voltage semiconductor device 100 includes a second well region 103. The second well region 103 is disposed on the semiconductor substrate 101 and adjacent to the first well region 102. In the embodiment, the second well region 103 is n-type. In some embodiments, the doping concentration of the second well region 103 is in a range between about $1 \times 10^{15}$ atoms/cm$^3$ and about $5 \times 10^{17}$ atoms/cm$^3$. In some embodiments, the second well region 103 is formed by an ion implantation process and a drive in process.

As shown in FIG. 1, the high-voltage semiconductor device 100 includes a first source region 104 and a first drain region 105. The first source region 104 and the first drain region 105 are disposed in the first well region 102 and the second well region 103, respectively. In the embodiment, the first source region 104 and the first drain region 105 are n-type. In some embodiments, the doping concentration of the first source region 104 and the first drain region 105 are higher than that of the first well region 102 and the second well region 103. In some embodiments, the doping concentration of the first source region 104 and the first drain region 105 is in a range between about $1 \times 10^{19}$ atoms/cm$^3$ and about $5 \times 10^{20}$ atoms/cm$^3$. In some embodiments, the first source region 104 and the first drain region 105 are formed by an ion implantation process.

As shown in FIG. 1, the high-voltage semiconductor device 100 includes a first gate structure 106. The first gate structure 106 is disposed on the epitaxial layer 121, and the first gate structure 106 is disposed on the first well region 102 and the second well region 103. In some embodiments, the first gate structure 106 includes a gate dielectric layer (not shown) and a gate electrode (not shown) disposed thereon. In some embodiments, the first gate structure 106 including the gate dielectric layer and the gate electrode is formed by blanket depositing a dielectric material layer (used to form the gate dielectric layer) and a conductive material layer (used to form the gate electrode) on the semiconductor substrate 101 in order, and then patterning the dielectric material layer and the conductive material layer by a lithography process and an etching process.

In some embodiments, the material of the dielectric material layer described above (i.e. the material of the gate dielectric layer) may include silicon oxide, silicon nitride, silicon oxynitride, high-k dielectric material, a combination thereof or another suitable dielectric material. In some embodiments, the dielectric material layer may be formed by chemical vapor deposition (CVD) or spin coating. The material of the conductive material layer (i.e. the material of the gate electrode) may be amorphous silicon, polysilicon, one or more metal, metal nitride, conductive metal oxide, a combination thereof or another suitable conductive material. The conductive material layer may be formed by chemical vapor deposition (CVD), sputtering, resistance heating evaporation, electron beam evaporation or another suitable deposition method. In addition, the first gate structure 106 may include insulating spacers (not shown) disposed on opposite sidewalls of the first gate structure 106.

As shown in FIG. 1, in some embodiments, the high-voltage semiconductor device 100 includes a buried layer 107. The buried layer 107 is disposed in the semiconductor substrate 101. In some embodiments, the buried layer 107 is overlapped with the first well region 102 and the second well region 103. In other words, in some embodiments, the buried layer 107 extends into the first well region 102 and the second well region 103 in the epitaxial layer 121. The buried layer 107 has a horizontal width w2. In some embodiments, the horizontal width w2 of the buried layer 107 is larger than the horizontal width w1 of the first well region 102. In some embodiments, the horizontal width w2 is in a range between about 7 μm and about 15 μm. In the embodiment, the buried layer 107 is p-type. In some embodiments, the doping concentration of the buried layer 107 is in a range between about $1\times10^{16}$ atoms/cm$^3$ and about $1\times10^{19}$ atoms/cm$^3$.

In some embodiments, p-type dopant (such as boron(B)) is implanted into the semiconductor substrate 101, the first well region 102 and the second well region 103 by an ion implantation process to form the busied layer 107 after the first well region 102 and the second well region 103 are formed. In some other embodiments, a p-type dopant (such as boron(B)) is implanted into the semiconductor substrate 101 by an ion implantation process to form the buried layer 107 before the first well region 102 and the second well region 103 are formed.

As shown in FIG. 1, in some embodiments, the high-voltage semiconductor device 100 includes a third well region 108. The third well region 108 is disposed on the semiconductor substrate 101 and adjacent to the first well region 102. In the embodiment, the second well region 103 and the third well region 108 are on opposite sides of the first well region 102. In the embodiment, the third well region 108 is n-type. In some embodiments, the doping concentration of the third well region 108 is in a range between about $1\times10^{15}$ atoms/cm$^3$ and about $5\times10^{17}$ atoms/cm$^3$. In some embodiments, the third well region 108 is formed by an ion implantation process and a drive in process.

In some embodiments, the high-voltage semiconductor device 100 includes a second source region 109 and a second drain region 110. The second source region 109 and the second drain region 110 are disposed in the first well region 102 and the third well region 108, respectively. In the embodiment, the second source region 109 and the second drain region 110 are n-type. In some embodiments, the doping concentration of the second source region 109 and the second drain region 110 are higher than that of the first well region 102 and the third well region 108. In some embodiments, the doping concentration of the second source region 109 and the second drain region 110 is in a range between about $1\times10^{19}$ atoms/cm$^3$ and about $5\times10^{20}$ atoms/cm$^3$. In some embodiments, the second source region 109 and the second drain region 110 are formed by an ion implantation process.

As shown in FIG. 1, the high-voltage semiconductor device 100 includes a second gate structure 111. The second gate structure 111 is disposed on the epitaxial layer 121, and the second gate structure 111 is disposed on the first well region 102 and the third well region 108. In some embodiments, the second gate structure 111 includes a gate dielectric layer (not shown) and a gate electrode (not shown) disposed thereon. In some embodiments, the second gate structure 111 including the gate dielectric layer and the gate electrode is formed by blanket depositing a dielectric material layer (used to form the gate dielectric layer) and a conductive material layer (used to form the gate electrode) on the semiconductor substrate 101 in order, and then patterning the dielectric material layer and the conductive material layer by a lithography process and an etching process.

In some embodiments, the buried layer 107 is overlapped with the first well region 102, the second well region 103 and the third well region 108. In other words, in some embodiments, the buried layer 107 extends into the first well region 102, the second well region 103 and the third well region 108 in the epitaxial layer 121. In some embodiments, the buried layer 107 is located directly below the first source region 104 and the second source region 109. In other words, the buried layer 107 is vertically overlapped with the first source region 104 and the second source region 109.

By the arrangement of the buried layer 107, the distance between the doping profile of the second well region 103 and the doping profile of the third well region 108 is significantly widened. Therefore, the charge punching from the second well region 103 to the third well region 108 is reduced, and the charge punching from the third well region 108 to the second well region 103 is also reduced, the leakage current is thereby reduced. Therefore, the high-voltage semiconductor device 100 having the buried layer 107 can have a high breakdown voltage. In other words, the buried layer 107 improves the withstand voltage of the high-voltage semiconductor device 100. In some embodiments, by the arrangement of the buried layer 107, the breakdown voltage of the high-voltage semiconductor device 100 is about 98V. In addition, in some embodiments, as the horizontal width of the buried layer 107 gradually increases (such as increasing from 7 μm to 10 μm), the breakdown voltage of the high-voltage semiconductor device 100 also gradually increases (such as increasing from 70V to 98V).

On the other hand, in the case that the buried layer 107 is not provided, the doping profile of the second well region 103 is closer to the doping profile of the third well region 108. It is easier for the charge to punch from the second well region 103 to the third well region 108, and it is also easier for the charge to punch from the third well region 108 to the second well region 103. Therefore, it is easier to have leakage current, and the breakdown voltage is lower. In some embodiments, in the case that the buried layer 107 is not provided, the breakdown voltage of the semiconductor device is about 4V. Accordingly, by the arrangement of the buried layer 107, the breakdown voltage of the semiconductor device can increase from about 4V to about 98V. The following figures will illustrate the difference of the semiconductor device caused by the presence of the buried layer.

In addition, since the buried layer 107 is buried in the semiconductor substrate 101 and away from the top surface of the high-voltage semiconductor device 100, the buried layer 107 may not influence the surface electric field, the threshold voltage (Vth) of the high-voltage semiconductor device 100 is thereby not influenced.

Since the arrangement of the buried layer 107 can reduce the punching between the well regions, device failure can be avoided when applying different voltages to the first drain region 105 and the second drain region 110. In some embodiments, a voltage of 40V is applied to the first drain region 105, and a voltage of 80V is applied to the second drain region 110.

Moreover, when applying different voltages to the first drain region 105 and the second drain region 110, in order to avoid device failure, different voltages may be further applied to the first gate structure 106 and the second gate structure 111 to have different saturation currents in different channels. Therefore, the element application is more flexible.

In some embodiments, the high-voltage semiconductor device 100 includes a first isolation structure 112 and a second isolation structure 113. The first isolation structure 112 is disposed on the second well region 103, and a portion of the first gate structure 106 extends onto the first isolation structure 112. The second isolation structure 113 is disposed on the third well region 108, and a portion of the second gate structure 111 extends onto the second isolation structure 113. In some embodiments, a portion of the first isolation structure 112 is buried in the second well region 103. In some embodiments, a portion of the second isolation structure 113 is buried in the third well region 108. In some embodiments, the first isolation structure 112 and the second isolation structure 113 are made of silicon oxide and are local oxidation of silicon (LOCOS) isolation structures formed by a thermal oxidation.

In some embodiments, the high-voltage semiconductor device 100 includes a first drift region 114 and a second drift region 115. The first drift region 114 surrounds the first drain region 105, and a portion of the first drift region 114 is overlapped with the first isolation structure 112. The second drift region 115 surrounds the second drain region 110, and a portion of the second drift region 115 is overlapped with the second isolation structure 113. In the embodiment, the first drift region 114 and the second drift region 115 are n-type. In some embodiments, the doping concentration of the first drift region 114 and the second drift region 115 is in a range between about $5\times10^{16}$ atoms/cm$^3$ and about $5\times10^{18}$ atoms/cm$^3$. In some embodiments, the first drift region 114 and the second drift region 115 are formed by an ion implantation process.

Since the first drift region 114 and the second drift region 115 respectively surround the first drain region 105 and the second drain region 110, the area of the depletion region is increased, and the reduced surface field (RESURF) effect is thereby achieved. Therefore, the breakdown voltage of the device is improved.

In some embodiments, the high-voltage semiconductor device 100 includes a heavily doped region 116. The heavily doped region 116 is disposed in the first well region 102, and the heavily doped region 116 is between the first source region 104 and the second source region 109. In the embodiment, the heavily doped region 116 is p-type. In some embodiments, the doping concentration of the heavily doped region 116 is in a range between about $1\times10^{19}$ atoms/cm$^3$ and about $5\times10^{20}$ atoms/cm$^3$. In some embodiments, the heavily doped region 116 is formed by an ion implantation process.

In some embodiments, the high-voltage semiconductor device 100 includes a body region 117. The body region 117 is disposed in the first well region 102 and surrounds the first source region 104, the second source region 109 and the heavily doped region 116. In some embodiments, the first gate structure 106 covers a portion of the body region 117, and the second gate structure 111 covers the other portion of the body region 117. In the embodiment, the body region 117 is p-type. In some embodiments, the doping concentration of the body region 117 is in a range between about $5\times10^{16}$ atoms/cm$^3$ and about $5\times10^1$ atoms/cm$^3$. In some embodiments, the body region 117 is formed by an ion implantation process.

Figure 2:
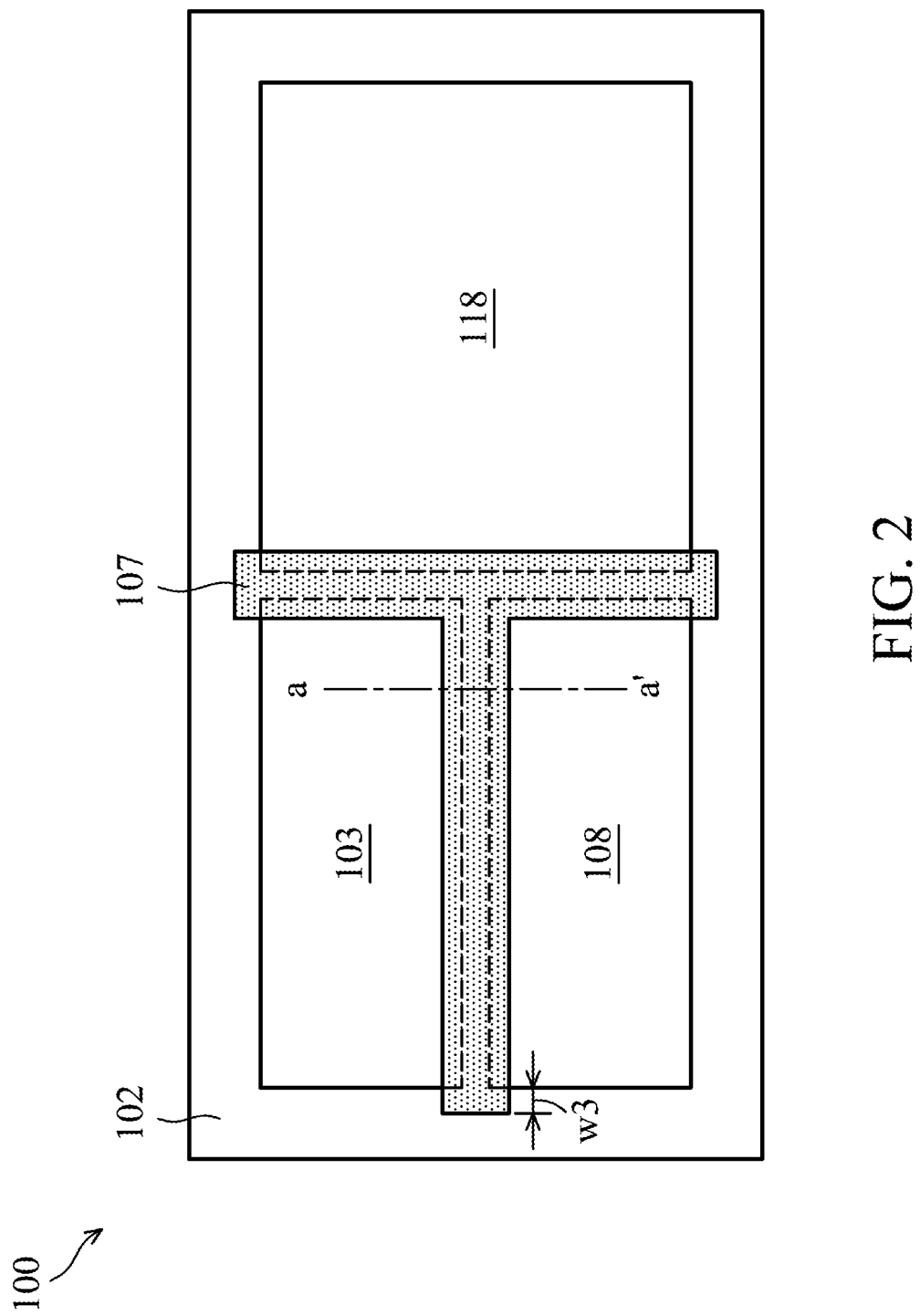
FIG. 2 shows a top view of a high-voltage semiconductor device according to some embodiments of the disclosure.

Refer to FIG. 2, which shows a top view of the high-voltage semiconductor device 100 according to some embodiments of the disclosure. FIG. 1 is a cross section taken along line a-a' of FIG. 2. As shown in FIG. 2, in some embodiments, a portion of the buried layer 107 is in the first well region 102 between the second well region 103 and the third well region 108, and a portion of the buried layer 107 extends into the second well region 103 and the third well region 108. In the embodiment, the boundary of the buried layer 107 exceeds the boundary of the second well region 103, and the boundary of the buried layer 107 does not exceed the boundary of the first well region 102. In other words, the buried layer 107 has a protruding portion extending beyond the second well region 103 and the third well region 108 in the top view. In some embodiments, the protruding portion of the buried layer 107 has a width w3. In some embodiments, the width w3 is larger than about 2 μm. In some other embodiments, a portion of the buried layer 107 is in the first well region 102 between the second well region 103 and the third well region 108, and the boundary of the buried layer 107 does not exceed the boundary of the first well region 102, the boundary of the second well region 103 and the boundary of the third well region 108.

Since the buried layer 107 has a protruding portion extending beyond the second well region 103 and the third well region 108 in the top view, the charge punching from the second well region 103 to the third well region 108 is further reduced, and the charge punching from the third well region 108 to the second well region 103 is also reduced. Therefore, the leakage current is further reduced, and the breakdown voltage of the device is improved.

As shown in FIG. 2, in some embodiments, the high-voltage semiconductor device 100 further includes a fourth well region 118. The first well region 102 is between the second well region 102 is between the second well region 103 and the fourth well region 118, and the first well region is between the third well region 108 and the fourth well region 118. In other words, the first well region 102 separates the second well region 103, the third well region 108 and the fourth well region 118. In the embodiment, the fourth well region 118 is n-type. In some embodiments, the doping concentration of the fourth well region 118 is in a range between about $1\times10^{15}$ atoms/cm$^{15}$ and about $5\times10^{17}$ atoms/cm$^3$. In some embodiments, the fourth well region 118 is formed by an ion implantation process and a drive in process.

It should be understood that there is a gate structure, an isolation structure, a drain region and a drift region on the fourth well region 118. The process and the material of these elements is the same as or similar to those of the first gate structure 106, the first isolation structure 112, the first drain region 105 and the first drift region 114. Therefore, it is not repeated herein.

As shown in FIG. 2, in some embodiments, a portion of the buried layer 107 is in the first well region 102 between the second well region 103 and the fourth well region 118, and a portion of the buried layer 107 extends into the second well region 103 and the fourth well region 118. In some embodiments, a portion of the buried layer 107 is in the first well region 102 between the third well region 108 and the fourth well region 118, and a portion of the buried layer 107 extends into the third well region 108 and the fourth well region 118. In some embodiments, the boundary of the buried layer 107 may exceed the boundary of the second well region 103 and boundary of the fourth well region 118, and the boundary of the buried layer 107 does not exceed the boundary of the first well region 102. In some embodiments, the boundary of the buried layer 107 may exceed the boundary of the third well region 108 and the boundary of the fourth well region 118, and the boundary of the buried layer 107 does not exceed the boundary of the first well region 102. In other words, in the top view, the buried layer 107 has a protruding portion extending beyond the second well region 103 and the fourth well region 118, and the buried layer 107 has a protruding portion extending beyond the third well region 108 and the fourth well region 118. In the embodiment, the buried layer 107 is T-shape in the top view. It should be understood that the shape of the buried layer 107 in the top view of FIG. 2 is merely an example, but it is not limited thereto, and the shape of the buried layer 107 in the top view may be determined according to the demands of a particular design.

Figure 3:
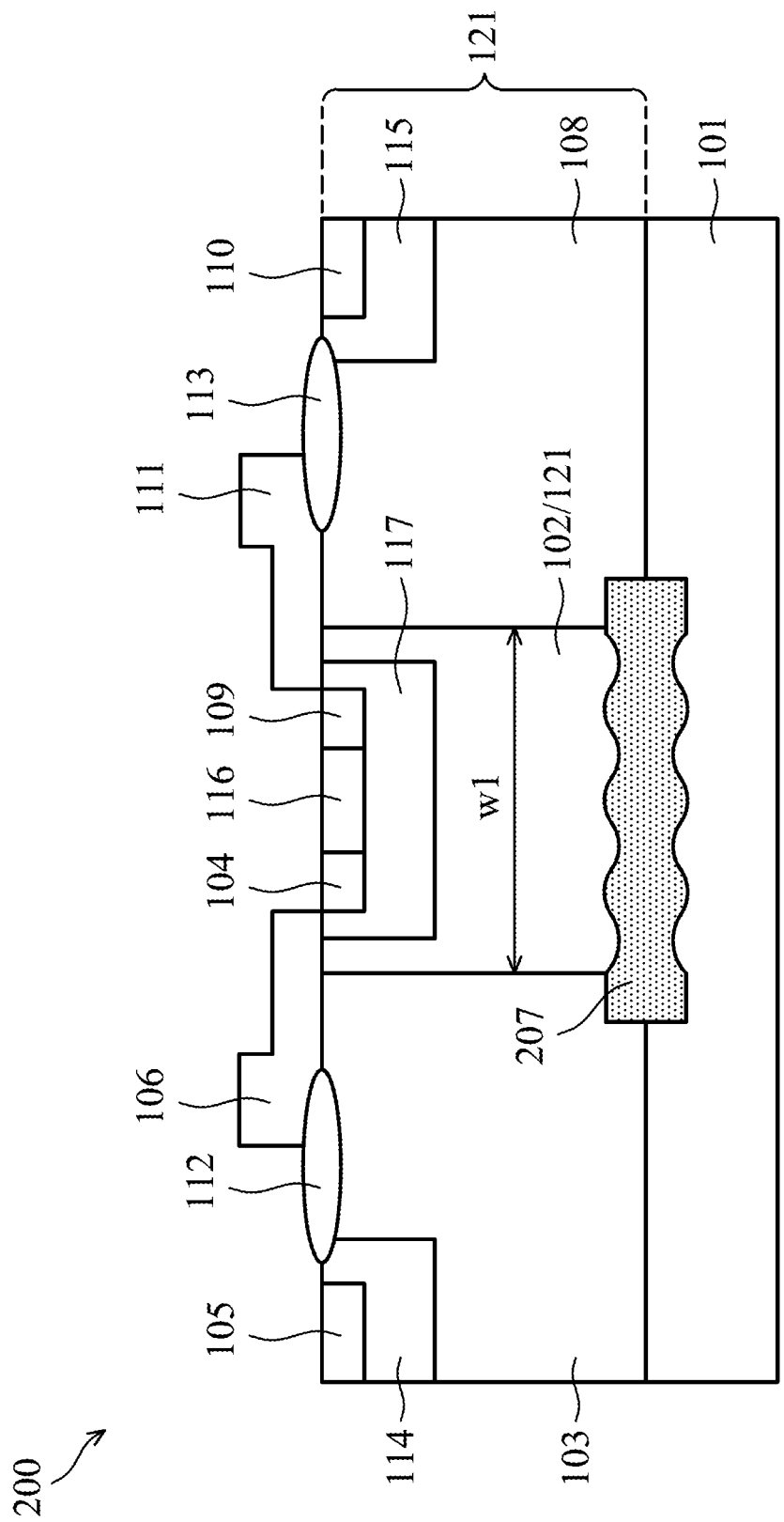
FIG. 3 shows a cross section of a high-voltage semiconductor device according to some embodiments of the disclosure.

Refer to FIG. 3, which shows a cross section of a high-voltage semiconductor device 200 according to some embodiments of the disclosure. Elements of the high-voltage semiconductor device 200 in FIG. 2 that are the same as those in FIG. 1 are labeled with the same reference numbers as in FIG. 1 and are not described again for brevity.

The structure of the high-voltage semiconductor device 200 shown in FIG. 3 is similar to that of the high-voltage semiconductor device 100 shown in FIG. 1. The difference therebetween is that the buried layer 207 of the high-voltage semiconductor device 200 includes a plurality of sections, and these sections are separated from one another. In the embodiment, each of the sections of the buried layer 207 is rectangular, and each of the sections connects together after a subsequent thermal process. As shown in FIG. 3, the width of the portion connecting the plurality of sections of the buried layer 207 is smaller than the width of the plurality of sections. Furthermore, the buried layer 207 is a wave shape. It should be understood that the shape of the buried layer 207 in FIG. 3 is merely an example, but it is not limited thereto, and the shape of the buried layer 207 is determined according to the demands of a particular design.

Figure 4:
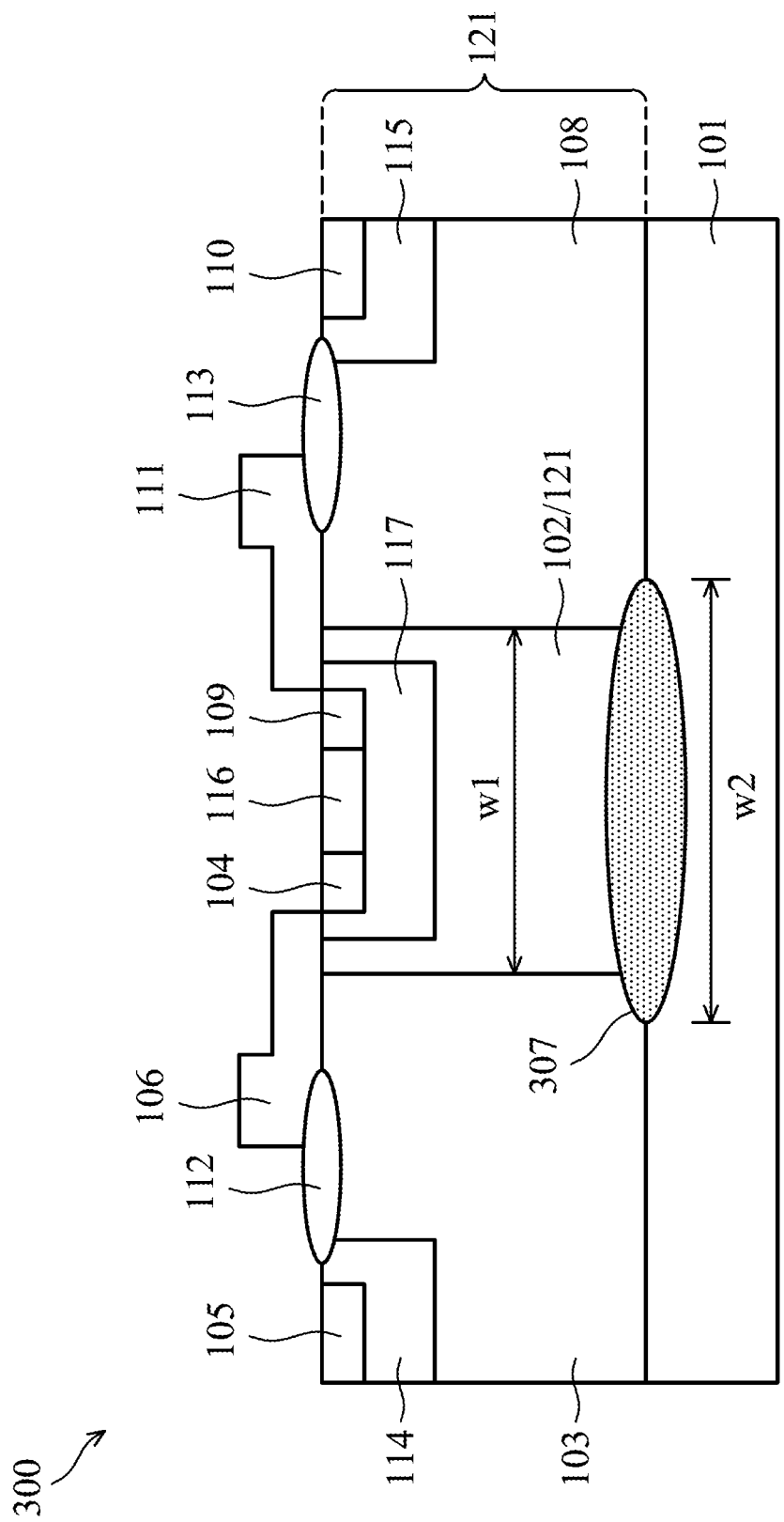
FIG. 4 shows a cross section of a high-voltage semiconductor device according to some embodiments of the disclosure.

Refer to FIG. 4, which shows a cross section of a high-voltage semiconductor device 300 according to some embodiments of the disclosure. Elements of the high-voltage semiconductor device 300 in FIG. 4 that are the same as those in FIG. 1 are labeled with the same reference numbers as in FIG. 1 and are not described again for brevity.

The structure of the high-voltage semiconductor device 300 shown in FIG. 4 is similar to that of the high-voltage semiconductor device 100 shown in FIG. 1. The difference therebetween is that the thickness of the buried layer 307 of the high-voltage semiconductor device 300 decreases along the direction from the first well region 102 to the second well region 103, and the thickness of the buried layer 307 decreases along the direction from the first well region 102 to the third well region 108. The buried layer 307 has a horizontal width w2. In some embodiments, the horizontal width w2 is in a range between about 7 μm and about 15 μm.

Figure 5:
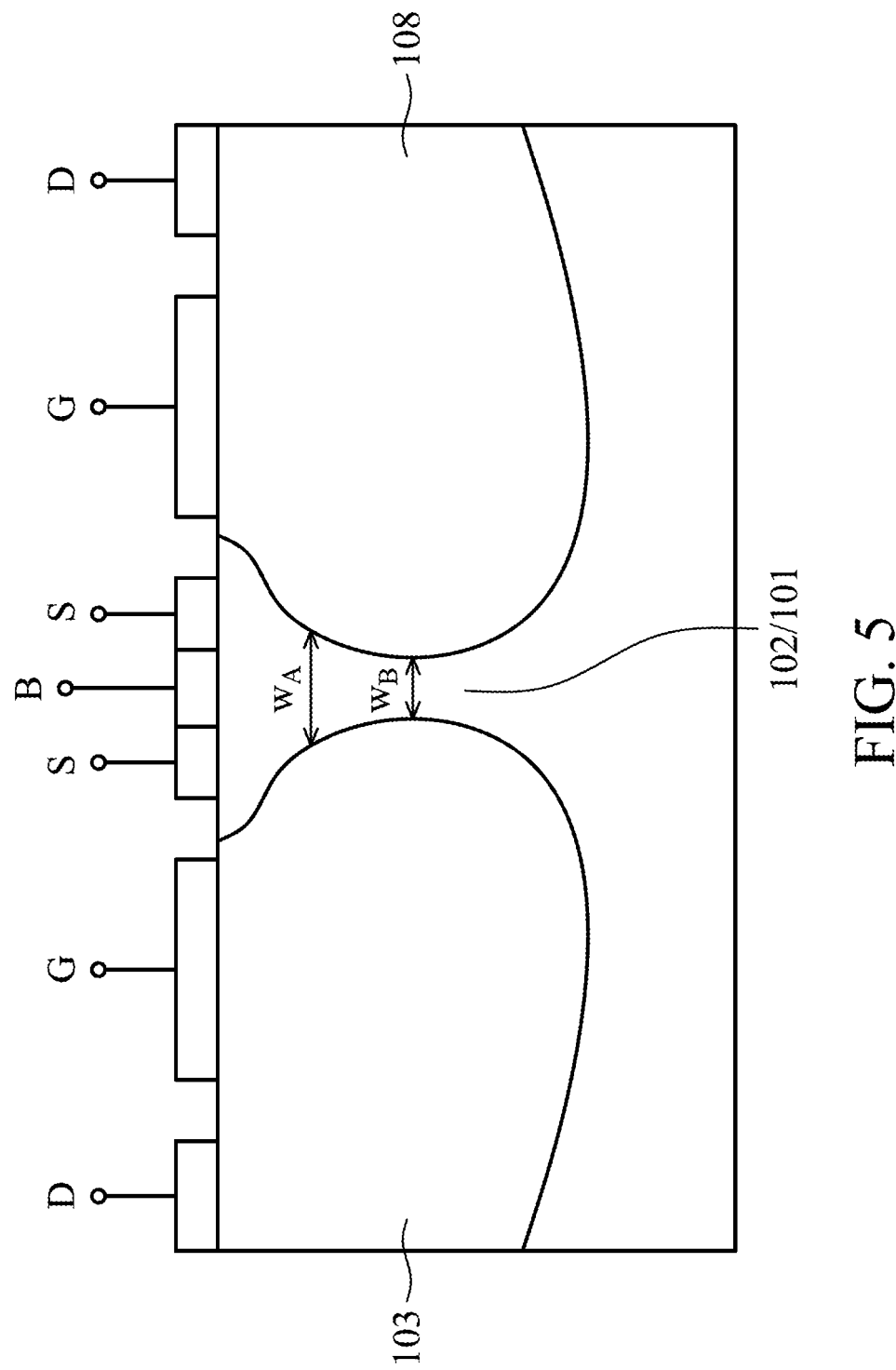
FIGS. 5 and 6 show doping profiles of a high-voltage semiconductor device according to some embodiments of the disclosure.
Figure 6:
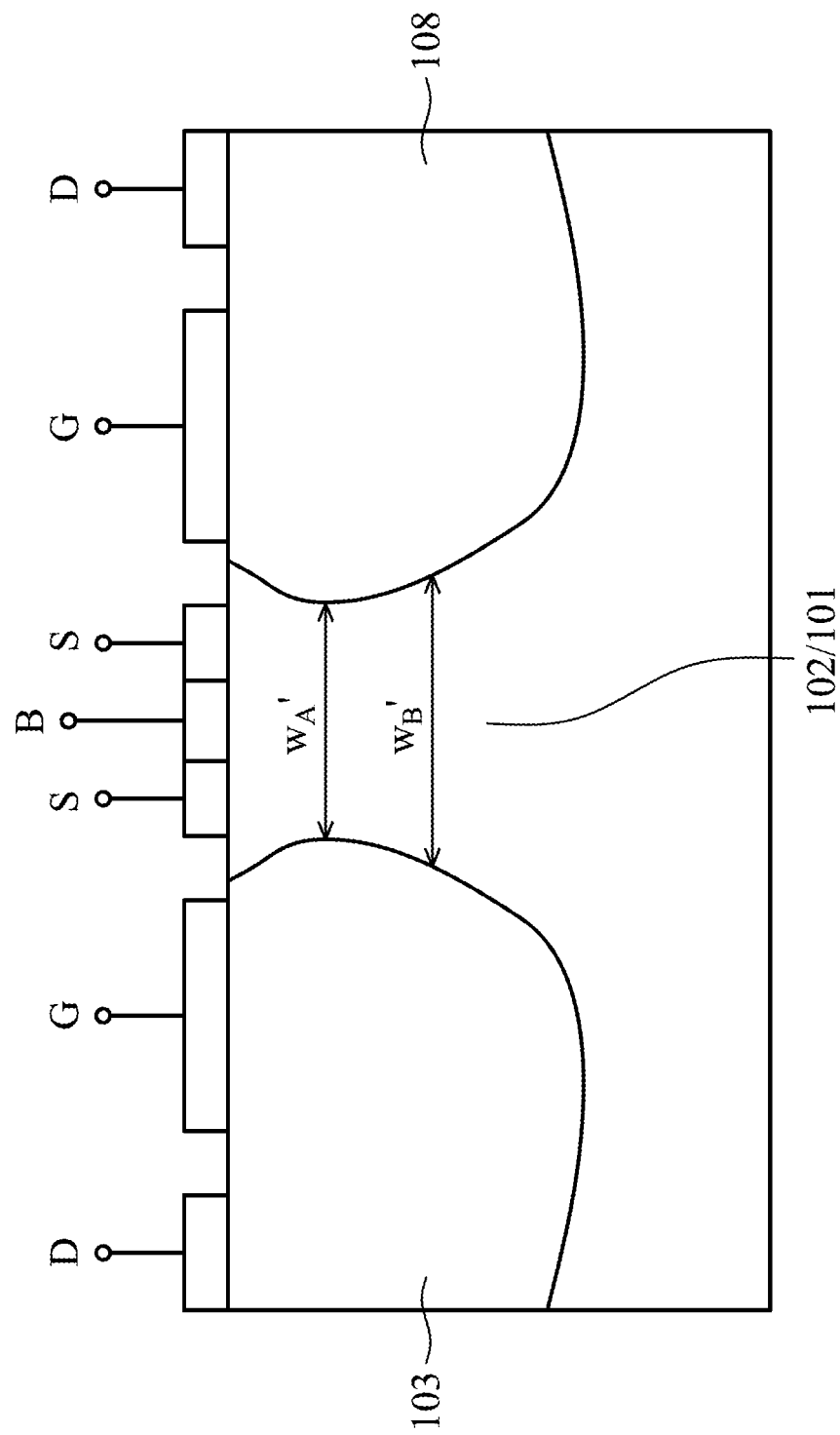

Refer to FIGS. 5 and 6, which show doping profiles of a high-voltage semiconductor device according to some embodiments of the disclosure. The difference between the high-voltage semiconductor device of FIG. 5 and the high-voltage semiconductor device of FIG. 6 is the presence of a buried layer. As shown in FIG. 5, in some embodiments, the high-voltage semiconductor device does not have a buried layer, and there is an upper distance $w_A$ and a lower distance $w_B$ between the second well region 103 and the third well region 108, wherein the lower distance $w_B$ is the shortest straight line distance between the second well region 103 and the third well region 108. As shown in FIG. 6, in the embodiment, the high-voltage semiconductor device has a buried layer, and there is an upper distance $w_A'$ and a lower distance $w_B'$ between the second well region 103 and the third well region 108, wherein the depth from the location of the upper distance $w_A'$ and the lower distance $w_B'$ to the top surface of the semiconductor device is the same as the depth from the location of the upper distance $w_A$ and the lower distance $w_B$ to the top surface of the semiconductor device, respectively. As shown in FIGS. 5 and 6, the upper distance $w_A'$ is larger than the upper distance $w_A$, and the lower distance $w_B'$ is larger than the lower distance $w_B$. In other words, by the arrangement of the buried layer, the distance between the second well region 103 and the third well region 108 is widened, and the doping profile of the first well region 102 (or the epitaxial layer 121) between the second well region 103 and the third well region 108 is enlarged.

According to some embodiments of the disclosure, by the arrangement of the buried layer in the high-voltage semiconductor device, the distance between the doping profiles of adjacent well regions is significantly widened. Therefore, the charge punching through between the well regions is reduced, and the leakage current is thereby reduced. Accordingly, the high-voltage semiconductor device having a buried layer can achieve high breakdown voltage. In other words, the buried layer improves the withstand voltage of the high-voltage semiconductor device. In addition, since the arrangement of the buried layer can reduce the charge punching through between the well regions, device failure can be avoided when applying different voltages to two adjacent drain regions. Moreover, since the buried layer is buried in the semiconductor substrate and away from the top surface of the high-voltage semiconductor device, the buried layer may not influence the surface electric field. Therefore, the threshold voltage of the high-voltage semiconductor device is thereby not influenced.

In addition, according to some embodiments of the disclosure, in the top view of the high-voltage semiconductor device, since the buried layer has a protruding portion extending beyond two adjacent well regions, the charge punching through between the well regions is further reduced. Therefore, the leakage current is further reduced, and the breakdown voltage of the device is improved, such that the device has a higher figure of merit (FOM).

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A high-voltage semiconductor device, comprising:
a semiconductor substrate having a first conductivity type;
a first well region disposed on the semiconductor substrate, wherein the first well region has the first conductivity type;
a second well region adjacent to the first well region, wherein the second well region has a second conductivity type that is opposite to the first conductivity type;
a first source region and a first drain region respectively disposed in the first well region and the second well region, wherein the first source region and the first drain region have the second conductivity type;
a first gate structure disposed on the first well region and the second well region; and
a buried layer disposed in the semiconductor substrate and having the first conductivity type, wherein the buried layer is overlapped with the first well region and the second well region, and the buried layer is directly below the first source region, and the buried layer has a protruding portion extending beyond the second well region in a top view.

2. The high-voltage semiconductor device of claim 1, further comprising:
a first isolation structure disposed on the second well region, wherein the first gate structure extends onto the first isolation structure.

3. The high-voltage semiconductor device of claim 1, further comprising:
a first drift region surrounding the first drain region and having the second conductivity type.

4. The high-voltage semiconductor device of claim 1, further comprising:
a heavily doped region adjacent to the first source region and having the first conductivity type; and
a body region surrounding the first source region and the heavily doped region and having the first conductivity type.

5. The high-voltage semiconductor device of claim 1, further comprising:
a third well region disposed on the semiconductor substrate and adjacent to the first well region, wherein the third well region has the second conductivity type;
a second source region and a second drain region respectively disposed in the first well region and the third well region, wherein the second source region and the second drain region have the second conductivity type; and
a second gate structure disposed on the first well region and the third well region.

6. The high-voltage semiconductor device of claim 5, wherein the buried layer is overlapped with the third well region.

7. The high-voltage semiconductor device of claim 6, wherein a boundary of the buried layer exceeds a boundary of the third well region.

8. The high-voltage semiconductor device of claim 5, further comprising:
a second isolation structure disposed on the third well region, wherein the second gate structure extends onto the second isolation structure; and
a second drift region surrounding the second drain region and having the second conductivity type.

9. The high-voltage semiconductor device of claim 5, further comprising:
a heavily doped region disposed between the first source region and the second source region; and
a body region surrounding the first source region, the second source region and the heavily doped region and having the first conductivity type.

10. A high-voltage semiconductor device, comprising:
a semiconductor substrate having a first conductivity type;
a first well region disposed on the semiconductor substrate, wherein the first well region has the first conductivity type;
a second well region and a third well region disposed on the semiconductor substrate and on opposite sides of the first well region, wherein the second well region and the third well region have a second conductivity type that is opposite to the first conductivity type;
a first source region and a first drain region respectively disposed in the first well region and the second well region, wherein the first source region and the first drain region have the second conductivity type;
a second source region and a second drain region respectively disposed in the first well region and the third well region, wherein the second source region and the second drain region have the second conductivity type;
a first gate structure disposed on the first well region and the second well region;
a second gate structure disposed on the first well region and the third well region; and
a buried layer disposed in the semiconductor substrate and vertically overlapped with the first source region and the second source region, wherein the buried layer has the first conductivity type,
wherein different voltages are simultaneously applied to the first drain region and the second drain region.

11. The high-voltage semiconductor device of claim 10, wherein a horizontal width of the buried layer is larger than a horizontal width of the first well region.

12. The high-voltage semiconductor device of claim 10, wherein the buried layer is overlapped with the first well region, the second well region and the third well region.

13. The high-voltage semiconductor device of claim 12, wherein the buried layer has a protruding portion extending beyond the second well region and the third well region in a top view.

14. The high-voltage semiconductor device of claim 10, further comprising:
a first isolation structure disposed on the second well region, wherein the first gate structure extends onto the first isolation structure; and
a second isolation structure disposed on the third well region, wherein the second gate structure extends onto the second isolation structure.

15. The high-voltage semiconductor device of claim 10, further comprising:
a first drift region surrounding the first drain region and having the second conductivity type; and
a second drift region surrounding the second drain region and having the second conductivity type.

16. A high-voltage semiconductor device, comprising:
a semiconductor substrate having a first conductivity type;
an epitaxial layer disposed on the semiconductor substrate, wherein the epitaxial layer has the first conductivity type;

a first well region and a second well region disposed in the epitaxial layer, wherein the first well region and the second well region have a second conductivity type that is opposite to the first conductivity type;

a first source region and a first drain region respectively disposed in the epitaxial layer between the first well region and the second well region and the first well region, wherein the first source region and the first drain region have the second conductivity type;

a second source region and a second drain region respectively disposed in the epitaxial layer between the first well region and the second well region and the second well region, wherein the second source region and the second drain region have the second conductivity type;

a first gate structure disposed on the epitaxial layer and overlapped with the first well region;

a second gate structure disposed on the epitaxial layer and overlapped with the second well region; and a buried layer disposed in the semiconductor substrate and having a portion extending into the epitaxial layer, the first well region and the second well region, wherein the buried layer has the first conductivity type, wherein different voltages are simultaneously applied to the first drain region and the second drain region.

17. The high-voltage semiconductor device of claim 16, wherein the buried layer comprises a plurality of sections separated from one another.

18. The high-voltage semiconductor device of claim 16, wherein a thickness of the buried layer decreases along a first direction from the epitaxial layer between the first well region and the second well region to the first well region, and the thickness of the buried layer decreases along a second direction from the epitaxial layer between the first well region and the second well region to the second well region.

19. The high-voltage semiconductor device of claim 16, wherein the buried layer has a protruding portion extending beyond the first well region and the second well region in a top view.

* * * * *